US 6,740,176 B2

(12) United States Patent
Ford et al.

(10) Patent No.: US 6,740,176 B2
(45) Date of Patent: May 25, 2004

(54) SINGLE CRYSTAL SEED ALLOY

(75) Inventors: David A Ford, Bristol (GB); Anthony D. Hill, Bristol (GB)

(73) Assignee: Rolls-Royce plc, London (GB)

( * ) Notice: Subject to any disclaimer, the term of this patent is extended or adjusted under 35 U.S.C. 154(b) by 0 days.

(21) Appl. No.: 09/859,532

(22) Filed: May 18, 2001

(65) Prior Publication Data

US 2002/0007778 A1 Jan. 24, 2002

(30) Foreign Application Priority Data

May 20, 2000 (GB) .............................. 0012185

(51) Int. Cl.$^7$ ............................... C22C 19/03
(52) U.S. Cl. ...................... 148/426; 420/441
(58) Field of Search .................. 420/441; 148/426; 162/122.2

(56) References Cited

U.S. PATENT DOCUMENTS

| 4,289,570 A | 9/1981 | Terkelsen |
| 4,353,405 A | 10/1982 | Kolakowski et al. |
| 4,469,161 A | 9/1984 | Higginbotham et al. |
| 4,707,192 A | * 11/1987 | Yamazaki et al. .......... 148/404 |
| 4,764,225 A | * 8/1988 | Shankar et al. ............. 148/404 |
| 4,900,394 A | * 2/1990 | Mankins ...................... 117/10 |
| 5,275,688 A | 1/1994 | Mori et al. |

FOREIGN PATENT DOCUMENTS

| EP | 0 581 547 A1 | 2/1994 |
| GB | 1 260 195 | 1/1972 |
| RU | 2158781 C1 * | 11/2000 |

OTHER PUBLICATIONS

ASM Handbook, vol. 3, "Alloy Phase Diagrams".*

* cited by examiner

*Primary Examiner*—Roy King
*Assistant Examiner*—Harry D Wilkins, III
(74) *Attorney, Agent, or Firm*—Oliff & Berridge, PLC

(57) ABSTRACT

An alloy composition suitable for use as a single crystal seed comprises nickel and, in the proportion of 5 to 50 weight %, a further metal selected from the Transition Series of elements in Period VI of the Periodic Table of Elements. The further metal may be tungsten or tantalum. The alloy composition contains no component which forms an oxide layer at elevated temperatures, and in particular contains no aluminium or titanium. The alloy composition is suitable for use as a seed alloy for the casting of single crystal components such as aerofoils for gas turbine engines.

19 Claims, No Drawings

SINGLE CRYSTAL SEED ALLOY

FIELD OF THE INVENTION

This invention concerns the composition of a metal alloy suitable for use as single crystal seeds.

BACKGROUND OF THE INVENTION AND PRIOR ART

Components cast as single crystals, using the process of directional solidification, generate a crystal atomic structure related to the growth of preferred crystal planes. In nickel base superalloys the resultant crystal has a structure determined by growth of the <001> crystal planes. This structure is aligned in the direction of solidification which is normally along the principal geometric axis of the component e.g. a gas turbine engine blade aerofoil.

In certain cases there are applications for components with crystal orientations different from the <001> produced under normal solidification conditions. Such applications include nozzle guide vanes and turbine blades requiring control of material rigidity.

To produce a crystal structure aligned in a direction other than the preferred solidification growth direction it is established practice to solidify from a seed crystal which has the required crystal structure. Solidification from these seeds is by epitaxial growth in which the molten superalloy solidifies directly from a partially melted seed crystal made from the same or equivalent superalloy as the cast component.

A drawback encountered with this known method of determining crystal growth direction during solidification is that a high level of castings are rejected because the seed crystals when partially molten are liable to generate unwanted oxide films which interrupt epitaxial growth of the single crystal and cause further crystals to solidify in which the atomic orientations are randomly distributed.

Epitaxial growth may also be interrupted if the alloy has a wide solidification temperature range (for example, greater than 50° C.). This is because an alloy having a wide solidification temperature range tends to form a large mushy zone during solidification (i.e. a zone in which liquid and solid phases coexist), in which random crystal growth can occur.

A principal objective of the present invention is to reduce the rejection rate of single crystal alloy castings.

A further objective of the present invention is to provide a formulation of an alloy suitable for use as a seed alloy for single crystal casting, which alloy does not produce oxide films under the directional solidification conditions used for the casting of superalloys.

A yet further objective of the present invention is to provide a formulation of an alloy suitable for use as a seed alloy for single crystal casting, which alloy has a relatively narrow solidification temperature range.

SUMMARY OF THE INVENTION

According to the present invention there is provided an alloy composition suitable for use as a single crystal seed, the alloy composition comprising nickel and, in the proportion of 5 to 50 weight %, a further metal selected from the Transition Series of elements in Period VI of the Periodic Table of Elements.

Preferably, the alloy composition contains no component which forms an oxide layer at the solidification temperature. In particular, the alloy composition contains no aluminium or titanium.

Preferred alloys in accordance with the present invention consist essentially of nickel and the further metal selected from the Transition Series of elements in Period VI of the Periodic Table of Elements. That is to say, the alloy composition preferably consists of those two components only, apart from incidental impurities, which should be minimised.

The further metal is preferably tungsten or tantalum, and is present in the range 13 to 50% by weight. Where the further metal is tungsten, it is more preferably present in the composition in the range 30 to 50% by weight. Where the further metal is tantalum, it is more preferably present in the composition in the range 25 to 45% by weight, for example approximately 30% by weight.

Preferred alloy compositions in accordance with the present invention are suitable for use in the manufacture of components such as gas turbine engine aerofoils and have a solidification temperature which is not less than 1250° C. and not more than 1450° C., and more preferably not less than 1300° C. and not more than 1400° C. Solidification takes place over a temperature range which is not greater than 50 C.°, and is preferably not greater than 20 C.°.

DETAILED DESCRIPTION OF PREFERRED EMBODIMENTS

Alloy compositions in accordance with the present invention which have been investigated and found to be useful included a two-component nickel/tungsten alloy containing tungsten in the range 5–45 weight %. Particularly suitable alloy compositions, having properties suitable for use as seed crystals in the manufacture of single crystal gas turbine engine components, contained tungsten in the range 30 to 45 weight %. However, the casting of components using seed crystals made from this range of alloys by conventional directional solidification was problematic owing to their high thermal conductivity, which made it difficult to control the rate of cooling during withdrawal from the single crystal casting furnace through its temperature transition zone.

The compositions investigated also included two-component nickel/tantalum alloys containing tantalum in the range 10–30 weight %. A particularly successful alloy contained 20% tantalum which solidifies at about 1400° C. and was found to be an effective seed alloy for the superalloy CMSX4. Tantalum levels of around 30% solidify at 1360° C. and are appropriate for casting single crystal components from alloys with melting points of around 1350° C. These compositions have melting temperatures which are not less than 1300° C. and not greater than 1400° C., these temperatures being appropriate for the majority of superalloys. The compositions have the added advantage of narrow solidification ranges, being not greater than 20° C., which reduce the potential for secondary crystal nucleation during solidification.

We claim:

1. An aluminum-free single crystal seed alloy composition comprising:
   nickel; and,
   in the proportion of 5 to 50 weight % a further metal selected from the Transition Series of elements in Period VI of the Periodic Table of elements.

2. A single crystal seed alloy composition as claimed in claim 1, which alloy composition has a solidification temperature which is not less than 1300° C. and not greater than 1400° C.

3. A single crystal seed alloy composition as claimed in claim 1 consisting essentially of nickel and the further metal.

4. A single crystal seed alloy composition as claimed in claim 1, wherein the further metal is present in the range 13 to 50 weight %.

5. A single crystal seed alloy composition as claimed in claim 1, wherein the alloy composition forms substantially no oxide layer when molten.

6. A single crystal seed alloy composition as claimed in claim 1, which alloy composition contains no titanium.

7. A single crystal seed alloy composition as claimed in claim 1, wherein the alloy has a solidification temperature range not greater than 50° C.

8. A single crystal seed alloy composition as claimed in claim 7, wherein the alloy has a solidification temperature range not greater than 20° C.

9. A single crystal seed alloy composition as claimed in claim 1, wherein the further metal comprises tungsten in the range 5 to 50 weight %.

10. A single crystal seed alloy composition as claimed in claim 9, wherein the tungsten is present in the range 13 to 40 weight %.

11. A single crystal seed alloy composition as claimed in claim 1, wherein the further metal comprises tantalum in the range 5 to 50 weight %.

12. A single crystal seed alloy composition as claimed in claim 11, wherein the tantalum is present in the range 13 to 50 weight %.

13. A single crystal seed alloy composition as claimed in claim 12, wherein the tantalum is present in the range 20 to 45 weight %.

14. A single crystal seed alloy composition as claimed in claim 13, wherein the tantalum is present in the range 25 to 35 weight %.

15. An aluminum-free single crystal seed alloy composition comprising:

nickel; and in the proportion of 5 to 50 weight % a further metal selected from the Transition Series of elements in Period VI of the Periodic Table of elements, wherein the alloy composition has a solidification temperature which is not less than 1300° C. and not greater than 1400° C., and a solidification temperature range which is not greater than 20° C.

16. An aluminum-free single crystal seed alloy composition consisting essentially of:

nickel; and, tantalum in the proportion of 13 to 45 weight %, wherein the alloy composition has a solidification temperature which is not less than 1300° C. and not greater than 1400° C., and a solidification temperature range which is not greater than 20° C.

17. An aluminum-free single crystal seed alloy composition consisting essentially of:

nickel; and tantalum in the proportion of 25 to 35 weight %, wherein the alloy composition has a solidification temperature which is not less than 1300° C. and not greater than 1400° C., and a solidification temperature range which is not greater than 20° C.

18. An aluminum-free single crystal seed alloy composition consisting essentially of:

nickel; and tungsten in the proportion of 5 to 50 weight %.

19. An aluminum-free single crystal seed alloy composition consisting essentially of:

nickel; and tungsten in the proportion of 13 to 40 weight %.

* * * * *